US008976510B2

(12) United States Patent
Lee

(10) Patent No.: US 8,976,510 B2
(45) Date of Patent: Mar. 10, 2015

(54) CABLE ASSEMBLY AND ELECTRONIC DEVICE

(75) Inventor: Sheng-Yuan Lee, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 719 days.

(21) Appl. No.: 13/039,272

(22) Filed: Mar. 2, 2011

(65) Prior Publication Data

US 2011/0249380 A1 Oct. 13, 2011

Related U.S. Application Data

(60) Provisional application No. 61/322,307, filed on Apr. 9, 2010.

(51) Int. Cl.

| | |
|---|---|
| ***H01R 11/00*** | (2006.01) |
| ***H05K 5/00*** | (2006.01) |
| ***H01R 31/06*** | (2006.01) |
| *H01R 107/00* | (2006.01) |

(52) U.S. Cl.

CPC ............ *H01R 31/06* (2013.01); *H01R 2107/00* (2013.01)

USPC ..................................... 361/679.01; 439/502

(58) Field of Classification Search

USPC ................................ 174/113, 112, 110, 68.1

See application file for complete search history.

(56) References Cited

U.S. PATENT DOCUMENTS

| | | | | |
|---|---|---|---|---|
| 6,824,426 | B1 * | 11/2004 | Spink, Jr. | 439/579 |
| 7,179,096 | B2 * | 2/2007 | Dube et al. | 439/76.1 |
| 7,660,131 | B2 * | 2/2010 | Drouillard et al. | 361/784 |
| 2008/0200072 | A1 * | 8/2008 | Cheong | 439/660 |
| 2008/0248672 | A1 * | 10/2008 | Yip | 439/300 |
| 2009/0094394 | A1 * | 4/2009 | Wu et al. | 710/72 |
| 2009/0113102 | A1 * | 4/2009 | Wang | 710/300 |
| 2009/0130906 | A1 * | 5/2009 | Tsao et al. | 439/626 |
| 2009/0240873 | A1 * | 9/2009 | Yu et al. | 711/103 |
| 2009/0286421 | A1 * | 11/2009 | Rugg et al. | 439/505 |
| 2010/0055980 | A1 * | 3/2010 | Chen et al. | 439/607.01 |

FOREIGN PATENT DOCUMENTS

| | | |
|---|---|---|
| CN | 201352610 Y | 11/2009 |
| TW | 200701563 | 1/2007 |

OTHER PUBLICATIONS

"1st Office Action of China Counterpart Application", issued on Sep. 21, 2011, p. 1-p. 5.

"Office Action of Taiwan counterpart application" issued on Dec. 22, 2012, p. 1-p. 7.

* cited by examiner

*Primary Examiner* — Jenny L Wagner
*Assistant Examiner* — Michael P McFadden
(74) *Attorney, Agent, or Firm* — Jianq Chyun IP Office

(57) ABSTRACT

An electronic device including an electronic unit and a cable assembly is provided. The cable assembly includes a first connector module, a second connector module, and a cable connecting between the first and the second connector modules. The first connector module detachably connected to the electronic device includes a serial advanced technology attachment (SATA) connector and a connector with at least four terminals.

18 Claims, 6 Drawing Sheets

CABLE ASSEMBLY AND ELECTRONIC DEVICE

CROSS-REFERENCE TO RELATED APPLICATION

This application claims the priority benefits of U.S. provisional application Ser. No. 61/322,307, filed on Apr. 9, 2010. The entirety of the above-mentioned patent applications is hereby incorporated by reference herein and made a part of this specification.

BACKGROUND

1. Field of the Invention

The invention relates to an electronic device. Particularly, the invention relates to an electronic device having a detachable cable assembly.

2. Description of Related Art

Universal serial bus 3.0 (USB 3.0) is a signal transmission specification developed from a conventional USB 2.0, and a transmission rate thereof may reach 5G bps, while a transmission rate of the conventional USB 2.0 is only 480M bps. Presently, a USB 3.0 connector is compatible to a USB 2.0 connector, i.e. the USB 3.0 connector includes a structure the same as that of the USB 2.0 connector, and a plurality of pins are added to provide the USB 3.0 function. In a system using the USB 2.0 chip, signal transmission can be performed through a cable assembly having the USB 2.0 connector. However, the structure of the USB 3.0 connector is more complicate than that of the USB 2.0 connector, so that fabrication cost of the cable assembly is relatively high.

SUMMARY OF THE INVENTION

The invention is directed to a cable assembly, which has detachable connectors.

The invention is directed to an electronic device, which has a relatively low fabrication cost by using detachable connectors.

The invention provides a cable assembly including a first connector module, a second connector module and a cable. The cable is connected between the first and the second connector modules. The first connector module includes a serial advanced technology attachment (SATA) connector and a connector with at least four terminals.

The invention provides an electronic device including an electronic unit and a cable assembly. The cable assembly includes a first connector module, a second connector module and a cable. The cable is connected between the first and the second connector modules. The first connector module is connected to the electronic unit. The first connector module includes a serial advanced technology attachment (SATA) connector and a connector with at least four terminals.

According to the above descriptions, the cable assembly divides the original USB 3.0 connector into a SATA connector and a connector with at least four terminals according to signal transmission characteristics thereof through the detachable connectors. In this way, the cable assembly may have relatively low fabrication cost under a premise of maintaining the USB 3.0 transmission performance.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
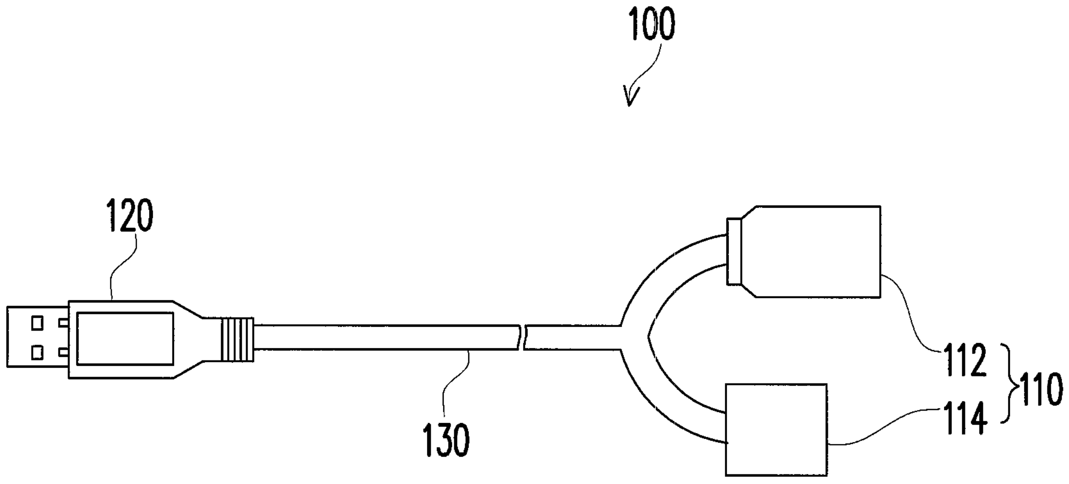
FIG. 1 is a schematic diagram of a cable assembly according to an embodiment of the invention.
Figure 1A:
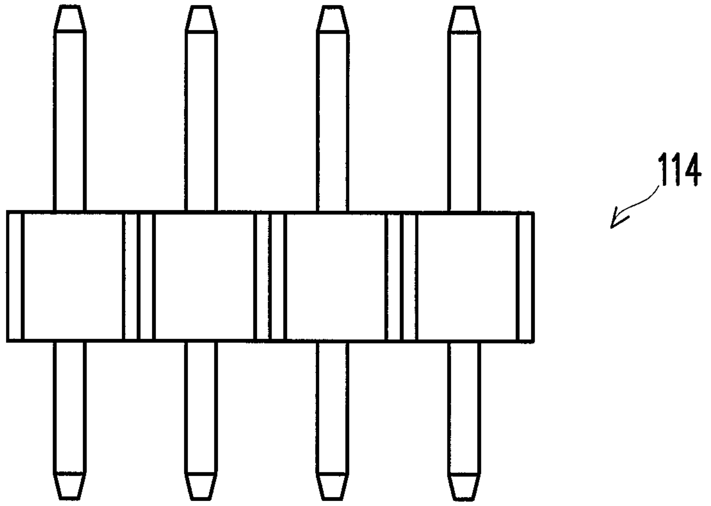
FIG. 1A is a schematic diagram of a first connector of FIG. 1.
Figure 2:
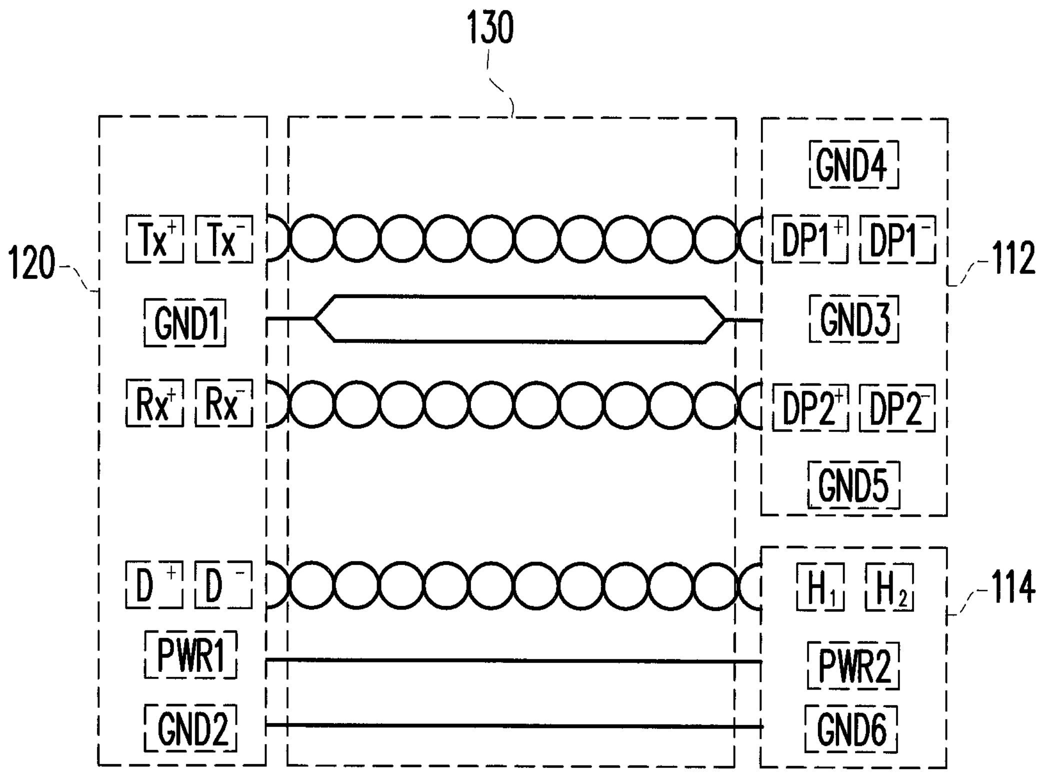
FIG. 2 is a schematic diagram illustrating electrical connection of the cable assembly of FIG. 1.

FIG. 1 is a schematic diagram of a cable assembly according to an embodiment of the invention. FIG. 1A is a schematic diagram of a first connector 114 of FIG. 1. FIG. 2 is a schematic diagram illustrating electrical connection of the cable assembly of FIG. 1. Referring to FIG. 1, FIG. 1A and FIG. 2, in the present embodiment, the cable assembly 100 includes a first connector module 110, a second connector module 120 and a cable 130 connected between the first connector module 110 and the second connector module 120. The first connector module 110 is, for example, a module having detachable connectors, and includes a first serial advanced technology attachment (SATA) connector 112 and a first connector 114 with at least four terminals.

In the present embodiment, the first connector 114 with at least four terminals can be a header connector (shown in FIG. 1A), which is adapted to data transmission of a universal serial bus 2.0 (USB 2.0) or former USB architectures. The second connector module 120 includes a connector having a plurality of pins, and such connector is, for example, a USB 3.0 connector. The cable 130 is a USB 3.0 cable, where the second connector module 120 and the cable 130 are all complied with standards customized by USB Implementers Forum (USB-IF). Moreover, the USB 3.0 connector in the second connector module 120 can be a plug connector or a receptacle connector, which is determined according to a type of another connector connected to the USB 3.0 connector. The second connector module 120 includes a pair of transmitting differential signal pins $T_x^+$ and $T_x^-$, a pair of receiving differential signal pins $R_x^+$ and $R_x^-$, a first ground pin GND1, a pair of transmitting/receiving differential signal pins $D^+$ and $D^-$, a power pin PWR1 and a second ground pin GND2. In detail, the transmitting differential signal pins $T_x^+$ and $T_x^-$, the receiving differential signal pins $R_x^+$ and $R_x^-$, the first ground pin GND1 serve as pins of a super-speed data transmission structure in the USB 3.0 architecture, and the transmitting/receiving differential signal pins $D^+$ and $D^-$, the power pin PWR1 and the second ground pin GND2 in the USB 3.0 architecture serve as pins compatible to the pins of the USB 2.0 or former USB architectures.

It should be noticed that the transmitting differential signal pins $T_x^+$ and $T_x^-$, the receiving differential signal pins $R_x^+$ and $R_x^-$, and the first ground pin GND1 are electrically connected to the SATA connector 112 through the cable 130, and the transmitting/receiving differential signal pins $D^+$ and $D^-$, the power pin PWR1 and the second ground pin GND2 are electrically connected to the first connector 114 with at least four terminals through the cable 130.

In detail, a transmission structure of the SATA connector is matched to a transmission structure of the USB 3.0 connector, and impedances thereof are similar. For example, a characteristic impedance of the SATA connector is about 100 ohm (Ω), and a characteristic impedance of the USB 3.0 connector is about 90 ohm (Ω). Therefore, the pins in the second connector module 120 serving as the super-speed data transmission structure that requires better transmission quality can be connected to the first SATA connector 112 through the cable 130. Namely, the transmitting differential signal pins $T_x^+$ and $T_x^-$ are electrically connected to receiving differential signal pins DP1$^+$ and DP1$^-$, the receiving differential signal pins $R_x^+$ and $R_x^-$ are electrically connected to transmitting differential signal pins DP2$^+$ and DP2$^-$, and the first ground pin GND1 is electrically connected to a third ground pin GND3. Moreover, in another embodiment that is not illustrated, the first ground pin GND1 can be electrically connected to the third ground pin GND3, a fourth ground pin GND4 and a fifth ground pin GND5 through a multi-core signal line, where the multi-core signal line is divided into three parts (three strands) to electrically connect to three ground pins GND3, GND4, and GND5 separately. Alternatively, the first ground pin GND1 is electrically connected to at least one of the third ground pin GND3, the fourth ground pin GND4 and the fifth ground pin GND5.

On the other hand, in the USB 3.0 architecture, impedance requirement of the pins compatible to the USB 2.0 or former USB architectures is lower than that of the pins serving for super-speed data transmission, so that the related pins not used for super-speed data transmission in the second connector module 120 are matched to the first connector 114 with at least four terminals. Namely, the transmitting/receiving differential signal pins $D^+$ and a compatible to the USB 2.0 or former USB architectures are electrically connected to transmitting/receiving differential signal pins H1 and H2, the power pin PWR1 is electrically connected to a power pin PWR2, and the second ground pin GND2 is electrically connected to a sixth ground pin GND6. In the present embodiment, the first connector 114 is implemented by a header connector with four terminals, though the invention is not limited thereto. The header connector may be a plug-type header connector or a receptacle-type header connector.

According to the above descriptions, the second connector module 120 having the USB 3.0 connector is connected to the first SATA connector 112 and the first connector 114 with at least four terminals, and the costs of the first SATA connector 112 and the first connector 114 with at least four terminals are lower than that of the single USB 3.0 connector. Therefore, not only the transmission performance of the USB 3.0 architecture is maintained, but also the fabrication cost of the whole cable assembly 100 compared with that of another cable assembly with two second connector modules 120 (having one USB 3.0 connector for each second connector modules 120) and the cable 130 is reduced. In other words, one end of the cable 130 connects with the second connector module 120, for example, a USB 3.0 connector; while the other end of the cable 130 connects with the first connector module 110 having detachable two connectors, for example, a SATA connector 112 and a first connector 114 with at least four terminals.

Further, since a part of the pins in the USB 3.0 architecture relates to the super-speed data transmission, signal quality requirement of the USB 3.0 architecture is stricter than that of the USB 2.0 architecture, so that the general USB 2.0 connector module having the header connector cannot be directly applied to the USB 3.0 connector module due to poor electrical match and lack of super-speed data transmission pins. Moreover, since pins of a single USB 3.0 connector are relatively more than the single USB 2.0 connector, and some of the pins relates to the super-speed data transmission, the single USB 3.0 connector has a higher fabrication cost compared to that of a single USB 2.0 header connector (for example, the first connector of the present embodiment), that of a single USB 2.0 connector or that of a single SATA connector. Moreover, since the SATA connector is widely used in electronic devices, electrical quality thereof is stable and cost thereof is relatively low. Therefore, in the invention, since the SATA connector has a transmission structure matched to the super-speed data transmission of the USB 3.0 connector, and has impedance similar to that of the USB 3.0 connector, the SATA connector is used for the super-speed data transmission in the USB 3.0 architecture. In the other hand, the USB 2.0 or former USB connector module having the header connector is used for data transmission pins compatible to the USB 2.0 or former USB architectures in the USB 3.0 architecture. In this way, not only the signal quality required by the USB 3.0 architecture is satisfied, but also the fabrication cost is reduced. Particularly, the header connector used for the USB 2.0 or former USB architectures has a low cost compared to the connectors complied with the USB specifications, such as A-type, B-type, and mini-type connectors, etc.

Figure 3:
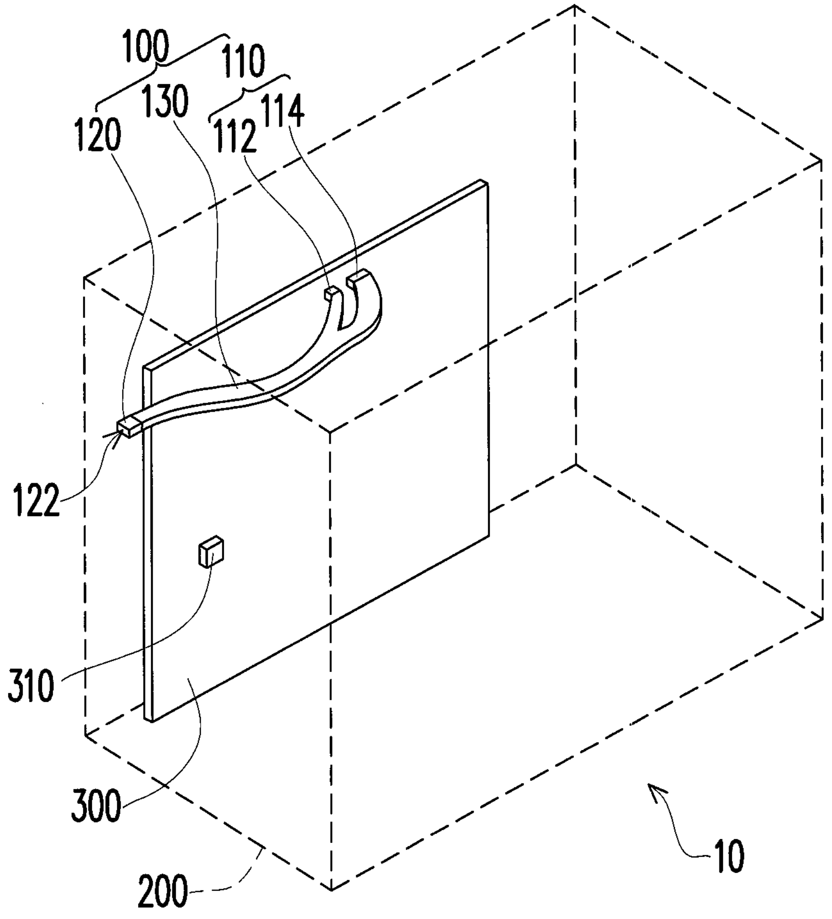
FIG. 3 is a schematic diagram of an electronic device according to an embodiment of the invention.

FIG. 3 is a schematic diagram of an electronic device according to an embodiment of the invention. Referring to FIG. 3, the electronic device 10 is, for example, a computer host, which includes a casing 200, and a first electronic unit 300 and a cable assembly 100 disposed in the casing 200, where the first electronic unit 300 is, for example, a motherboard, and is configured with a control chip 310 of the USB 3.0 architecture, a south bridge chip or a chip set (not shown) integrated south and north bridge chips containing the USB 3.0 function for controlling signal transmission under the USB 3.0 specification. Related components of the cable assembly 100 are already described in the above embodiment, so that detailed descriptions thereof are not repeated herein.

In the present embodiment, in order to implement the signal transmission of the USB 3.0 architecture of the electronic device 10, the first connector module 110 of the cable assembly 100 that has detachable connectors (for example, the first SATA connector 112 and the first connector 114 with at least four terminals of the aforementioned embodiment) is detachably connected to the first electronic unit 300, and the second connector module 120 is disposed on an inner surface of the casing 200, and an opening 122 of the second connector module 120 is exposed outside the casing 200 for connecting other peripheral devices. In the present embodiment, since the second connector module 120 is exposed to the outside through the opening 122 to provide a connection interface for an external USB connector (not shown), the second connector is a receptacle connector. It should be noticed that in the USB architecture, although the types of the USB connectors are specified (for example, the A-type, the B-type and the mini-type, etc.), the specification of the USB architecture only limits the USB connector which is exposed to outside of the electronic device for the user using, while the USB connector deposited in the electronic device is not limited. In this way, although the first connector module 110 having the detachable connectors of the invention does not follow the specifications of the USB architecture, since it is used in the internal portion of the electronic device 10, it is fine not to follow the above the specifications of the USB architecture. Therefore, the electronic device 10 of the invention may have the signal transmission function of the USB 3.0 architecture and have a low cost through the detachable cable assembly 100.

Figure 4:
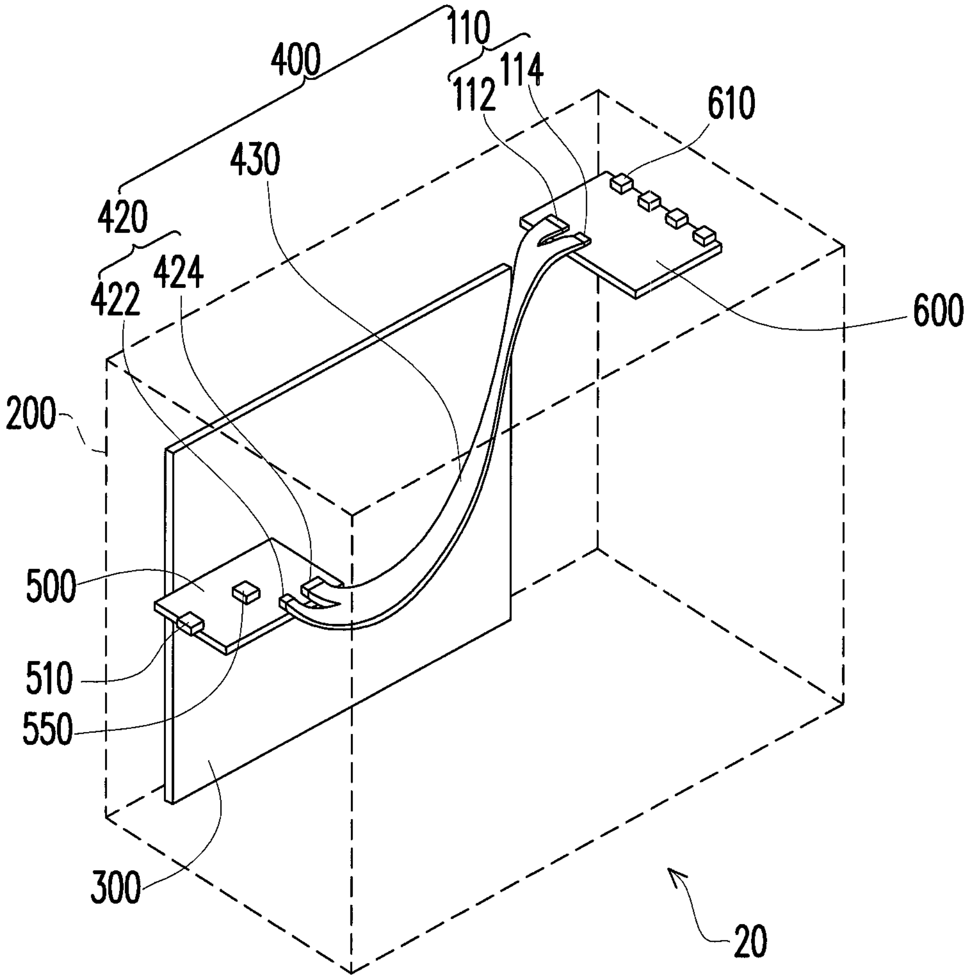
FIG. 4 is a schematic diagram of an electronic device according to another embodiment of the invention.
Figure 5:
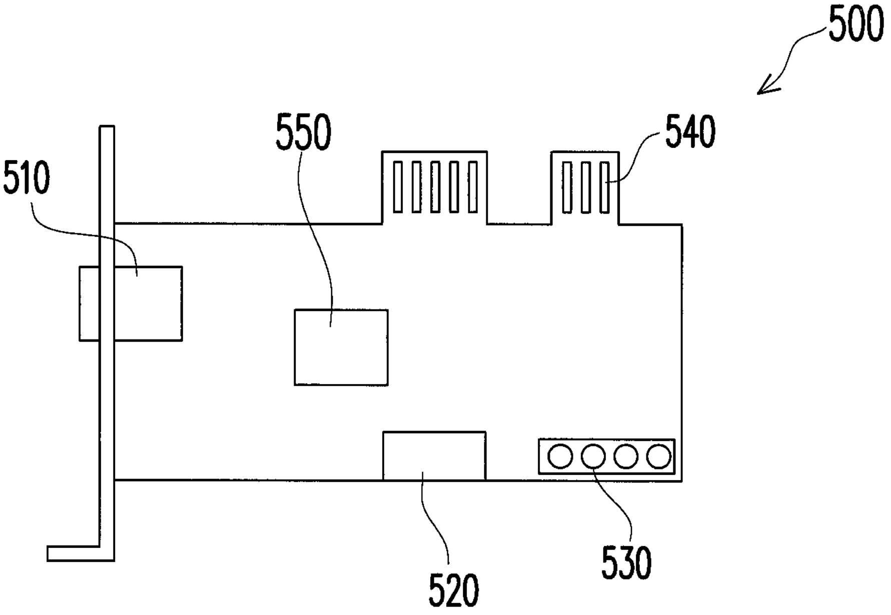
FIG. 5 is a schematic diagram of a second electronic unit in the electronic device of FIG. 4.
Figure 6:
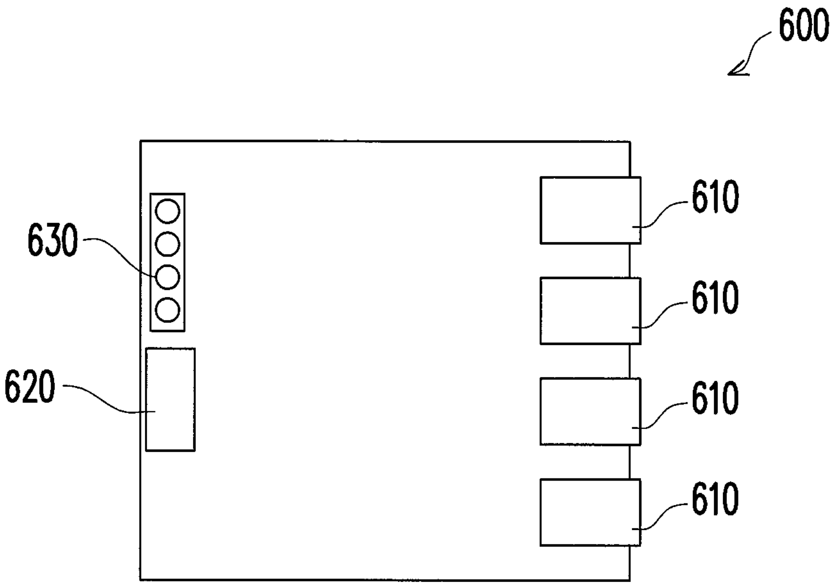
FIG. 6 is a schematic diagram of a third electronic unit in the electronic device of FIG. 4.

FIG. 4 is a schematic diagram of an electronic device according to another embodiment of the invention. FIG. 5 is a schematic diagram of a second electronic unit 500 in the electronic device of FIG. 4. FIG. 6 is a schematic diagram of a third electronic unit 600 in the electronic device of FIG. 4. Referring to FIG. 4 to FIG. 6, different to the above embodiment, the electronic device 20 includes a cable assembly 400, a second electronic unit 500 and a third electronic unit 600 disposed in a casing 200, where the second electronic unit 500 is, for example, an add-on card, and a control chip 550 of the USB 3.0 architecture is thereon. When the second electronic unit 500 has the control chip of the USB 3.0 architecture, the first electronic unit 300 can or can not have the other control chip of the USB 3.0 architecture (such as control chip 310 in FIG. 3) depending on the existence of the control chip with the USB 3.0 architecture of the second electronic unit 500. Moreover, the second electronic unit 500 further has a USB 3.0 connector 510, a third SATA connector 520 and a third connector 530 with at least four terminals, where the USB 3.0 connector 510 is similar to the second connector 120 of FIG. 3 used by users. The second electronic unit 500 is electrically connected to the first electronic unit 300 through a peripheral component interconnect express (PCI-E) interface 540, so that the first electronic unit 300 has the signal transmission function of the USB 3.0 architecture.

Moreover, the third electronic unit 600 is, for example, a hub including a plurality of USB 3.0 connectors 610, a fourth SATA connector 620 and a fourth connector 630 with at least four terminals, where the USB 3.0 connector 610 is similar to the USB 3.0 connector 510 of the second electronic unit 500, or is similar to the second connector 120 of FIG. 3 used for users. Furthermore, the USB 3.0 connectors 610 are used to implement signal transmission between the electronic device 20 and other peripheral devices (not shown) outside the electronic device 20 through the USB 3.0 architecture.

A second connector module 420 of the cable assembly 400 includes a second SATA connector 422 and a second connector 424 with at least four terminals, where the second connector 424 is, for example, a header connector with at least four terminals, though the invention is not limited thereto. The second SATA connector 422 and the second connector 424 of the cable assembly 400 are detachably connected to the third SATA connector 520 and the third connector 530 of the second electronic unit 500, respectively, and the first SATA connector 112 and the first connector 114 of the first connector module 110 are detachably connected to the fourth SATA connector 620 and the fourth connector 630 of the third electronic unit 600. It should be noticed that the connectors in the connector modules 110 and 420 of the cable assembly 400 are respectively connected to the connectors in the electronic units 500 and 600 through a relationship of plug-receptacle connection. In this way, the first electronic unit 300 may have the signal transmission function of the USB 3.0 architecture through the second electronic unit 500, and can implement connection port expansion through the third electronic unit 600. Taking the third electronic unit 600 as an example, one connection port can be expanded to four connection ports though the invention is not limited thereto.

Figure 7:
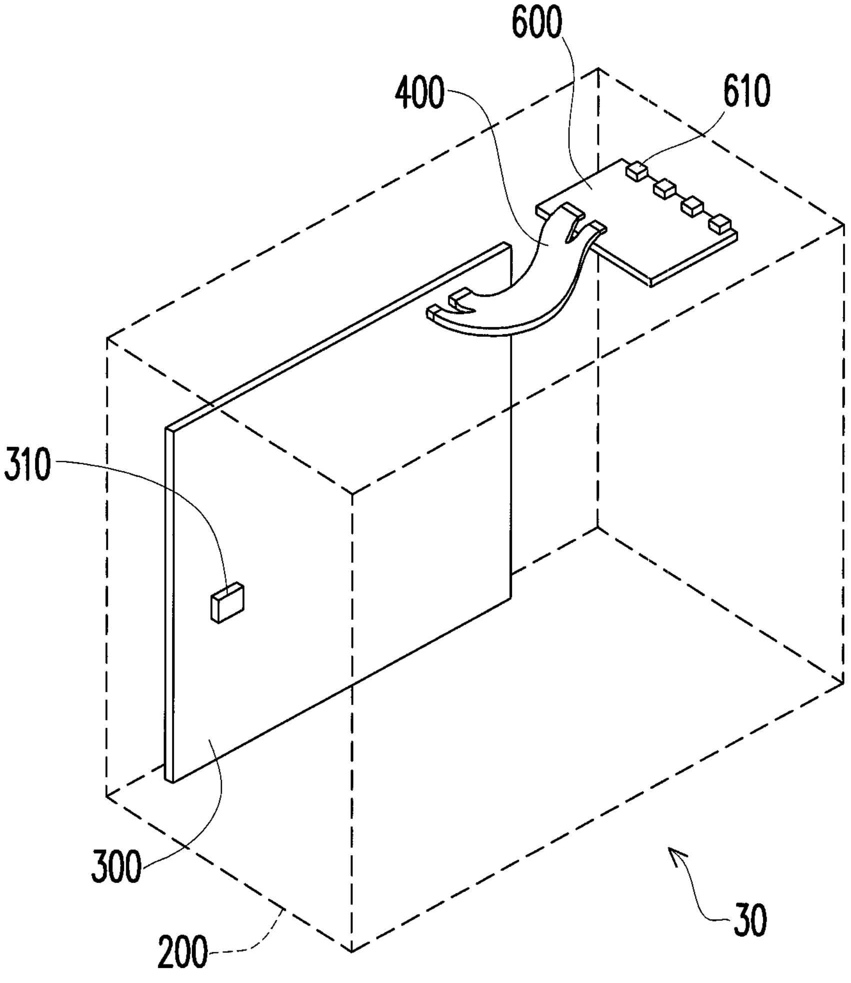
FIG. 7 is a schematic diagram of an electronic device according to another embodiment of the invention.

FIG. 7 is a schematic diagram of an electronic device according to another embodiment of the invention. Different to the above embodiments, the first electronic unit 300 has the control chip 310 of the USB 3.0 architecture, a south bridge chip or a chip set (not shown) integrated south and north bridge chips containing the USB 3.0 function. In this way, the third electronic unit 600 can be electrically connected to the first electronic unit 300 through the cable assembly 400 for expanding the connection ports.

According to the above descriptions, the connection type of the cable assembly 100 or 400 is not limited by the invention, which not only serves as a signal transmission structure between the electronic device 10 and the peripheral devices (not shown) outside the electronic device 10, but also as a signal transmission structure between two electronic units in the casing 200 of the electronic device 20 or 30, which is determined according to an actual fabrication and utilization requirement of the electronic device 10, 20 or 30.

In summary, in the above embodiments of the invention, the detachable cable assembly is used to divide the signal USB 3.0 connector into a SATA connector and a connector with at least four terminals according to signal transmission characteristics thereof, so as to reduce a fabrication cost of the cable assembly.

Moreover, in the electronic device, the cable assembly can be connected between various electronic units in the casing to serve as a device of signal transmission, so that the electronic device can has the signal transmission function of the USB 3.0 architecture through the low cost SATA connector and the connector having at least four terminals.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A cable assembly for data transmission of USB 3.0, comprising:
- a first connector module, comprising:
  - a first serial advanced technology attachment (SATA) connector;
  - a first connector with only four terminals, wherein the first connector with only four terminals is a universal serial bus 2.0 (USB 2.0) connector, and two of four terminals are compatible to transmitting/receiving differential signals of USB 2.0;
- a second connector module, wherein the second connector module is only compatible to data transmission of USB 3.0; and
- a cable, connected between the first connector module and the second connector module, wherein the cable is only compatible to data transmission of USB 3.0.

2. The cable assembly as claimed in claim 1, wherein the second connector module comprises a connector having a plurality of pins, and the connector comprises:
- a pair of transmitting differential signal pins Tx+ and Tx−;
- a pair of receiving differential signal pins Rx+ and Rx−;
- a first ground pin;
- a pair of transmitting/receiving differential signal pins D+ and D−;
- a first power pin; and
- a second ground pin,
- wherein the pair of transmitting differential signal pins Tx+ and Tx−, the pair of receiving differential signal pins Rx+ and Rx− and the first ground pin are electrically connected to the first SATA connector through the cable, and the pair of transmitting/receiving differential signal pins D+ and D−, the first power pin and the second ground pin are electrically connected to the first connector with only four terminals through the cable.

3. The cable assembly as claimed in claim 2, wherein the first SATA connector has a pair of receiving differential signal pins DP1+ and DP1−, a pair of transmitting differential signal pins DP2+ and DP2−, a third ground pin, a fourth ground pin and a fifth ground pin, the pair of receiving differential signal pins DP1+ and DP1− is electrically connected to the pair of transmitting differential signal pins Tx+ and Tx− of the connector, the pair of transmitting differential signal pins DP2+ and DP2− is electrically connected to the pair of receiving differential signal pins Rx+ and Rx− of the connector, and the first ground pin of the connector is electrically connected to at least one of the third ground pin, the fourth ground pin and the fifth ground pin.

4. The cable assembly as claimed in claim 2, wherein the first connector with only four terminals has a pair of transmitting/receiving differential signal pins H1 and H2, a second power pin and a sixth ground pin, the pair of transmitting/receiving differential signal pins H1 and H2 is electrically connected to the pair of transmitting/receiving differential signal pins D+ and D− of the connector, the second power pin is electrically connected to the first power in of the connector, and the sixth ground pin is electrically connected to the second ground pin of the connector.

5. The cable assembly as claimed in claim 1, wherein the first connector with only four terminals is a header connector.

6. The cable assembly as claimed in claim 1, wherein the second connector module has a USB 3.0 connector.

7. The cable assembly as claimed in claim 1, wherein the second connector module, comprising:

a second SATA connector, electrically connected to the first SATA connector through the cable; and a second connector with only four terminals, electrically connected to the first connector with only four terminals through the cable, wherein the second SATA connector is physically separated from the second connector with only four terminals.

8. The cable assembly as claimed in claim 7, wherein the second connector with only four terminals is a USB 2.0 connector, and two of four terminals are compatible to transmitting/receiving differential signals of USB 2.0.

9. An electronic device, comprising:

a first electronic unit; and a cable assembly for data transmission of USB 3.0, comprising:

a first connector module, connected to the first electronic unit, and comprising:

a first serial advanced technology attachment (SATA) connector; and a first connector with only four terminals, wherein the first connector with only four terminals is a USB 2.0 connector, and two of four terminals are compatible to transmitting/receiving differential signals of USB 2.0;

a second connector module, wherein the second connector module is only compatible to data transmission of USB 3.0; and a cable, connected between the first connector module and the second connector module, wherein the cable is only compatible to data transmission of USB 3.0.

10. The electronic device as claimed in claim 9, wherein the first electronic unit is one of a motherboard, an add-on card and a hub.

11. The electronic device as claimed in claim 9, further comprising:

a second electronic unit, wherein the second connector module is connected to the second electronic unit; and a casing, wherein the first electronic unit, the cable assembly and the second electronic unit are disposed in the casing.

12. The electronic device as claimed in claim 11, wherein the first electronic unit and the second electronic unit are two of a motherboard, an add-on card and a hub.

13. The electronic device as claimed in claim 9, wherein the second connector module comprises a connector having a plurality of pins, and the connector comprises:

a pair of transmitting differential signal pins Tx+ and Tx−;

a pair of receiving differential signal pins Rx+ and Rx−;

a first ground pin;

a pair of transmitting/receiving differential signal pins D+ and D−;

a first power pin; and a second ground pin, wherein the pair of transmitting differential signal pins Tx+ and Tx−, the pair of receiving differential signal pins Rx+ and Rx− and the first ground pin are electrically connected to the first SATA connector through the cable, and the pair of transmitting/receiving differential signal pins D+ and D−, the first power pin and the second ground pin are electrically connected to the first connector with at least only four terminals through the cable, the pair of transmitting differential signal pins Tx+ and Tx− is electrically connected to a pair of receiving differential signal pins DP1+ and DP1− of the first SATA connector, the pair of receiving differential signal pins Rx+ and Rx− is electrically connected to a pair of transmitting differential signal pins DP2+ and DP2− of the first SATA connector, and the first ground pin is electrically connected to at least one of a third ground pin, a fourth ground pin and a fifth ground pin of the first SATA connector, the pair of transmitting/receiving differential signal pins D+ and D− is electrically connected to a pair of transmitting/receiving differential signal pins H1 and H2 of the first connector, the first power pin is electrically connected to a second power pin of the first connector, and the second ground pin is electrically connected to a sixth ground pin of the first connector.

14. The electronic device as claimed in claim 9, further comprising:

a casing, wherein the first electronic unit and the cable assembly are disposed in the casing, and an opening of the second connector module is exposed outside the casing.

15. The electronic device as claimed in claim 9, wherein the second connector module has a USB 3.0 connector.

16. The cable assembly as claimed in claim 7, wherein the second connector with only four terminals is a header connector.

17. The electronic device as claimed in claim 9, wherein the second connector module, comprising:

a second SATA connector, electrically connected to the first SATA connector through the cable; and a second connector with only four terminals, electrically connected to the first connector with only four terminals through the cable, wherein the second SATA connector is physically separated from the second connector with only four terminals.

18. The electronic device as claimed in claim 17, wherein the second connector with only four terminals is a USB 2.0 connector, and two of four terminals are compatible to transmitting/receiving differential signals of USB 2.0.

* * * * *